(12) United States Patent
Choi

(10) Patent No.: US 7,424,082 B2
(45) Date of Patent: Sep. 9, 2008

(54) DIGITAL LOCK DETECTOR FOR PLL

(75) Inventor: Dong M Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 811 days.

(21) Appl. No.: 10/916,251

(22) Filed: Aug. 11, 2004

(65) Prior Publication Data

US 2006/0038595 A1  Feb. 23, 2006

(51) Int. Cl.
*H04L 7/00* (2006.01)
(52) U.S. Cl. .................. 375/371; 375/373; 375/375; 375/376
(58) Field of Classification Search .................. 375/371, 375/373, 375, 376
See application file for complete search history.

(56) References Cited

U.S. PATENT DOCUMENTS

| | | | |
|---|---|---|---|
| 3,956,710 A | 5/1976 | Seitz et al. | |
| 4,100,503 A | 7/1978 | Lindsey et al. | |
| 4,125,815 A | 11/1978 | Kirschner | |
| 4,151,463 A | 4/1979 | Kibler | |
| 4,213,096 A | 7/1980 | Daniel, Jr. | |
| 4,437,072 A | 3/1984 | Asami | |
| 4,617,520 A | 10/1986 | Levine | |
| 4,724,402 A | 2/1988 | Ireland | |
| 4,860,321 A | 8/1989 | von der Embse | |
| 4,866,402 A | 9/1989 | Black | |
| 4,870,382 A | 9/1989 | Keate et al. | |
| 5,099,213 A | 3/1992 | Yamakawa et al. | |
| 5,124,671 A | 6/1992 | Srivastava | |
| 5,126,690 A | 6/1992 | Bui et al. | |
| 5,294,894 A | 3/1994 | Gebara | |
| 5,304,952 A | 4/1994 | Quiet et al. | |
| 5,525,932 A | 6/1996 | Kelkar et al. | |
| 5,530,383 A * | 6/1996 | May | 327/39 |
| 5,703,526 A | 12/1997 | Meyer | |
| 5,719,532 A | 2/1998 | Nayebi et al. | |
| 5,724,007 A | 3/1998 | Mar | |
| 5,734,273 A | 3/1998 | Mudd | |
| 5,784,122 A | 7/1998 | Nayebi et al. | |
| 5,909,130 A | 6/1999 | Martin et al. | |
| 5,969,576 A | 10/1999 | Trodden | |
| 6,133,769 A | 10/2000 | Fontana et al. | |

(Continued)

*Primary Examiner*—Mohammad Ghayour
*Assistant Examiner*—Juan A. Torres
(74) *Attorney, Agent, or Firm*—Ropes & Gray LLP; Jeffrey H. Ingerman; Chia-Hao La

(57) ABSTRACT

Circuits and methods for detecting a lock condition of a phase-locked loop (PLL) circuit are provided. A frequency divider outputs a clock having a frequency equal to a reference clock frequency divided by N. A counter counts the number (M) of clock edges of a PLL output clock received during a given time interval of the frequency-divided reference clock. When M satisfies a predetermined relationship to N (e.g., M=N), the PLL output clock is locked to the frequency of the reference clock. A phase sampler compares the phases of the PLL output clock, a delayed PLL output clock and either the reference clock or a delayed reference clock. When the phase of the reference clock or delayed reference clock is between the phases of the PLL output clock and the delayed PLL output clock, the PLL output clock is also locked to the phase of the reference clock.

28 Claims, 6 Drawing Sheets

U.S. PATENT DOCUMENTS

| | | |
|---|---|---|
| 6,229,864 B1 | 5/2001 | DuFour |
| 6,314,150 B1 | 11/2001 | Vowe |
| 6,320,469 B1 | 11/2001 | Friedberg et al. |
| 6,411,143 B1 | 6/2002 | Fernandez-Texon |
| 6,466,058 B1 | 10/2002 | Goldman |
| 6,496,554 B1 | 12/2002 | Ahn |
| 6,522,204 B1 * | 2/2003 | Rennick ................. 331/1 A |
| 6,566,920 B1 | 5/2003 | Kim |
| 6,580,328 B2 * | 6/2003 | Tan et al. ................. 331/17 |
| 6,714,083 B2 | 3/2004 | Ishibashi |
| 6,744,838 B1 | 6/2004 | Dixit |
| 6,762,631 B1 | 7/2004 | Kumar |
| 6,765,444 B2 | 7/2004 | Wang et al. |

* cited by examiner

DIGITAL LOCK DETECTOR FOR PLL

BACKGROUND OF THE INVENTION

This invention relates to circuits and methods for detecting a lock condition of a phase-locked loop (PLL) circuit. More particularly, this invention relates to circuits and methods for detecting a PLL lock condition using digital components.

PLL circuits are widely used in many clock recovery applications. Typically, a PLL circuit locks (i.e., synchronizes) a clock output by a voltage-controlled oscillator (VCO) to a reference clock. An associated PLL lock detector outputs a LOCK signal indicating when the VCO clock is locked. When the PLL lock detector outputs the LOCK signal, the VCO clock is used to control one or more processes of an associated device or chip. In this way, the processes of the device or chip are synchronized to the reference clock. Synchronization to a reference clock is important, for example, in high-speed memory devices in which memory device processing must rigidly comply with precise timing requirements.

Conventional lock detectors use an analog low pass filter (i.e., integrator) and an analog comparator to detect a lock condition of an associated PLL circuit. Such PLL lock detectors are described in Tan et al. U.S. Pat. No. 6,580,328, issued Jun. 17, 2003. It is well-known that analog designs are more difficult to mass produce reliably within stated specifications and are less portable to various process technologies than digital designs.

In view of the foregoing, it would be desirable to provide circuits and methods for detecting a lock condition of a PLL circuit that rely less on analog components and more on digital components.

SUMMARY OF THE INVENTION

It is an object of this invention to provide circuits and methods for using digital components to detect a lock condition of a phase-locked loop (PLL) circuit.

In accordance with this invention, a digital lock detector is provided for detecting whether a clock generated by an associated PLL voltage-controlled oscillator (VCO) is locked to the phase and frequency of a reference clock. A frequency divider receives the reference clock as input, and outputs a clock having a frequency equal to the reference clock frequency divided by N. A counter counts the number (M) of clock edges (e.g., rising edges) of the VCO clock received during a given time interval of the frequency-divided reference clock. When the counted value of M satisfies a predetermined relationship of M to N (e.g., M=N), the VCO clock is locked to the frequency of the reference clock. A phase sampler compares the phases of the VCO clock, a delayed version of the VCO clock and either the reference clock or a delayed version of the reference clock. When the phase of the reference clock or delayed reference clock is between the phases of the VCO clock and the delayed VCO clock, the VCO clock is also locked to the phase of the reference clock. The digital lock detector outputs a LOCK signal indicating that the VCO clock is locked to both the phase and frequency of the reference clock.

The invention also provides methods for detecting a lock condition of a PLL circuit.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention relates to using digital components to detect a lock condition of a phase-lock loop (PLL) circuit.

Figure 1:
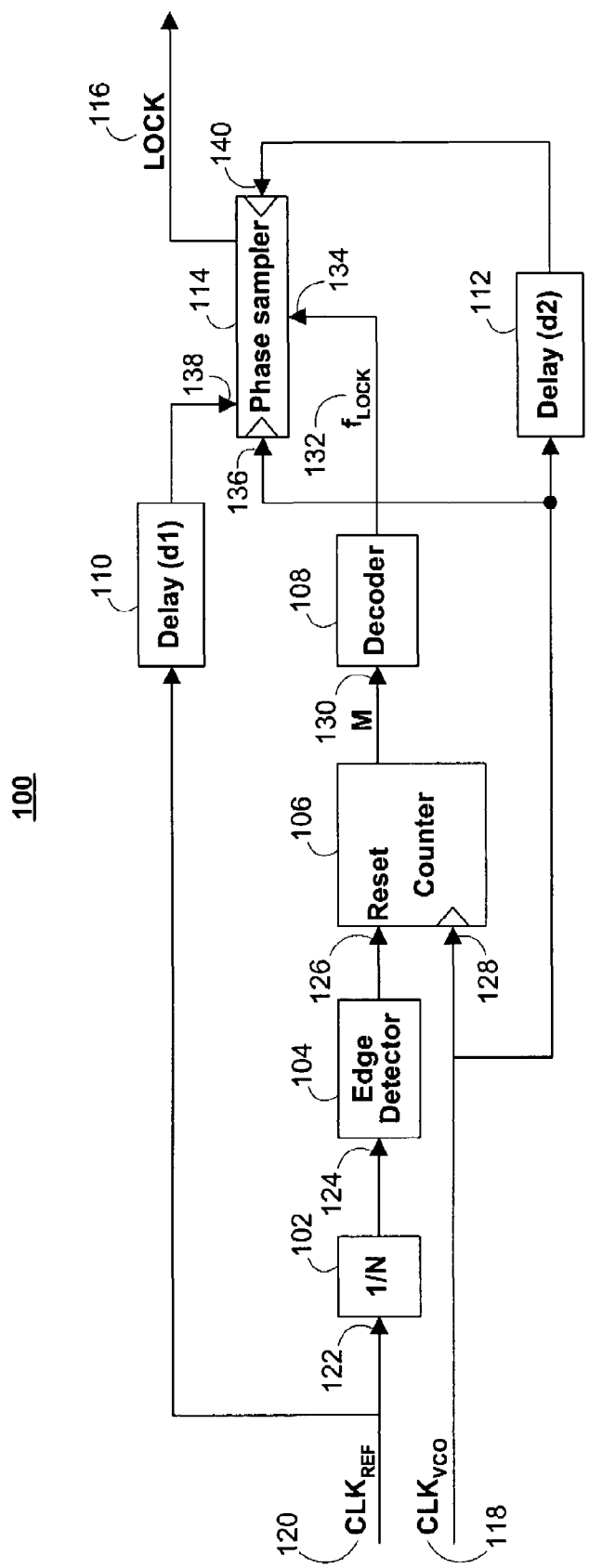
FIG. 1 is a block diagram of a digital lock detector in accordance with the present invention.

FIG. 1 shows a digital lock detector 100 in accordance with the present invention. Digital lock detector 100 includes divide-by-N frequency divider 102, edge detector 104, counter 106, decoder 108, delays 110 and 112 and phase sampler 114. As described below, delay 110 may be optionally included in digital lock detector 100. Digital lock detector 100 outputs LOCK signal 116 indicating whether clock 118 generated by a PLL voltage-controlled oscillator ($CLK_{VCO}$) is locked to both the frequency and phase of reference clock 120 ($CLK_{REF}$).

Digital lock detector 100 detects whether clock 118 is locked to the frequency of reference clock 120 as follows: Frequency divider 102 receives reference clock 120 having a first frequency ($f_{REF}$) at input 122, and outputs a clock having a second frequency ($f_2$) that is equal to the reference clock frequency divided by N (i.e., $f_2=f_{REF}/N$). Edge detector 104 receives the frequency-divided clock at input 124. In response to an edge of input signal 124 (e.g., a rising edge), the output of edge detector 104 changes digital states. Counter 106 receives the output of edge detector 104 at input 126 (i.e., a Reset input) and clock 118 at input 128. Counter 106 counts the number (M) of clock edges (e.g., rising edges) of clock 118 that counter 106 receives at input 128 between first and second digital state changes at input 126. In response to the second digital state change, counter 106 outputs a signal indicating the counted value of M to input 130 of decoder 108. When M satisfies a predetermined relationship to N (e.g., M=N), decoder 108 outputs $f_{LOCK}$ signal 132 indicating that clock 118 is locked to the frequency of reference clock 120. Frequency detection by digital lock detector 100 is further described below in connection with FIGS. 2 and 3.

Digital lock detector 100 detects whether clock 118 is locked to the phase of reference clock 120 as follows: Phase sampler 114 receives $f_{LOCK}$ signal 132 at input 134. When $f_{LOCK}$ signal 132 is not received at input 134 (i.e., when clock 118 is not locked to the frequency of reference clock 120), phase sampler 114 is disabled from outputting LOCK signal 116. Phase sampler 114 also receives VCO clock 118 at input 136, reference clock 120 or reference clock 120 delayed by delay (d1) 110 at input 138, and VCO clock 118 delayed by delay (d2) 112 at input 140. The value of d2 determines the maximum phase error that can be observed in clock 118 relative to reference clock 120 when digital lock detector 100 outputs LOCK signal 116 indicating that clock 118 is locked to the phase of clock 120. For reasons described below, d2 and d1 are selected such that d2 is greater than d1, and preferably, such that d2 is twice d1 (i.e., d2=2*d1) when delay 110 is included in digital lock detector 100. Phase sampler 114 compares the phases of input signals 136, 138 and 140. When the phase of input signal 138 is between the phases of input signals 136 and 140, clock 118 is locked to the phase of reference clock 120. Thus, provided that $f_{LOCK}$ signal 132 is received at input 134, phase sampler 114 outputs LOCK signal 116 when the phase of input signal 138 is between the phases of input signals 136 and 140. In general, VCO clock 118 is locked to the frequency of reference clock 120 before clock 118 is locked to the phase of clock 120. Phase detection by digital lock detector 100 is further described below in connection with FIGS. 4 and 5.

Figure 2:
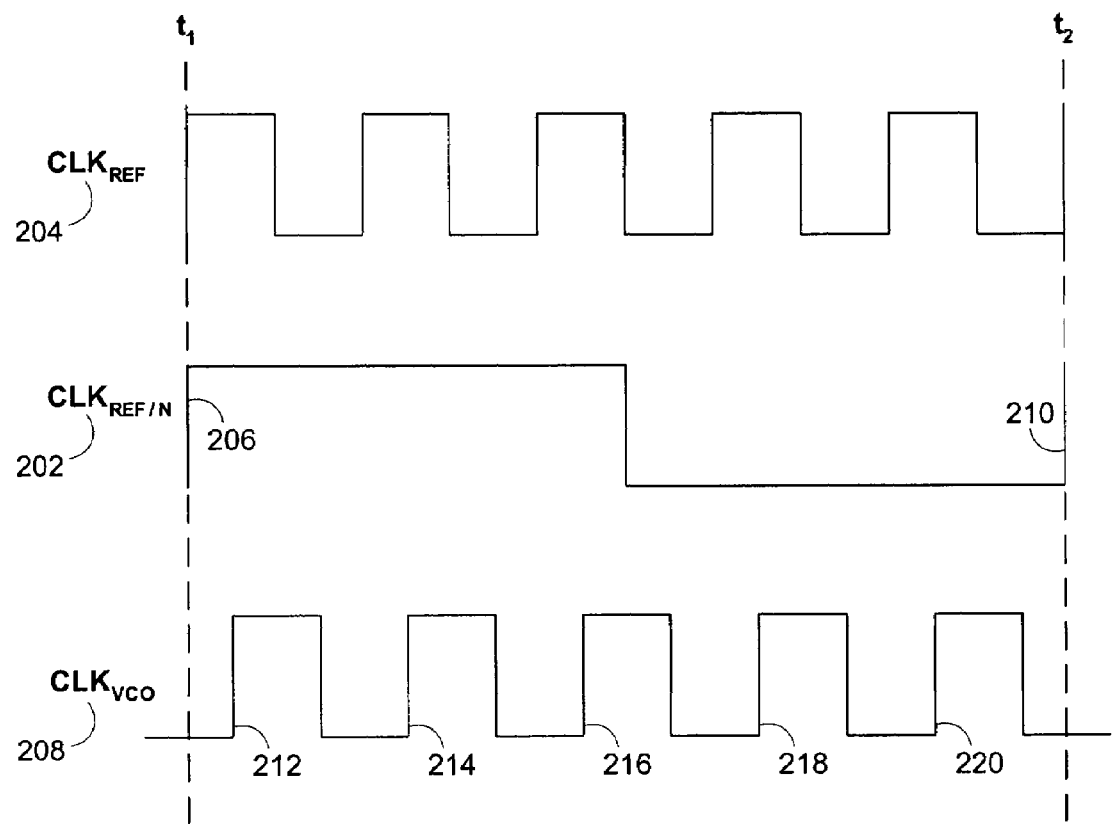
FIG. 2 is a timing diagram illustrating operation of the frequency divider, edge detector and counter of the digital lock detector of FIG. 1 in accordance with one embodiment of the present invention.

FIG. 2 is a timing diagram that illustrates operation of frequency divider 102, edge detector 104 and counter 106 of digital lock detector 100 (FIG. 1) in accordance with one embodiment of the present invention. FIG. 2 shows the example in which N=5 (i.e., frequency divider 102 is a divide-by-5 frequency divider). Referring to FIGS. 1 and 2, frequency divider 102 generates clock 202 having a frequency that is five times less than the frequency of reference clock 204 (i.e., reference clock 204 cycles through 5 clock periods in time ($t_2$−$t_1$) required for clock 202 to cycle through one clock period). At time $t_1$, edge detector 104 receives first rising edge 206 of clock 202 at input 124. In response, the output of edge detector 104 changes digital states. This causes counter 106 to start counting the number of rising edges of VCO clock 208 that counter 106 receives at input 128. At time $t_2$ (i.e., after clock 202 cycles through one full clock period), edge detector 104 receives second rising edge 210 of clock 202 at input 124. In response, the output of edge detector 104 again changes digital states. This causes counter 106 to discontinue (e.g., restart) counting VCO clock edges. As shown, five rising edges 212, 214, 216, 218 and 220 (i.e., M=5) of VCO clock 208 are received by counter 106 during the time interval from $t_1$ to $t_2$. Thus, counter 106 outputs a signal indicating that M=5 to decoder 108. As shown in FIG. 2, VCO clock 208 and reference clock 204 have the same frequency.

In the embodiment of FIG. 2, edge detector 104 and counter 106 are triggered by rising edges of clocks 202 and 208, respectively. Edge detector 104 and counter 106 are not responsive to falling edges of clocks 202 and 208. In some embodiments of the present invention, one or both of edge detector 104 and counter 106 may be triggered by falling edges of input signals 124 and 128. For example, edge detector 104 and counter 106 may be triggered only when falling edges of input signals 124 and 128 are received. This causes counter 106 to count the number of falling edges of VCO clock 118 that counter 106 receives at input 128 during successive falling edges (i.e., one clock period) of the frequency-divided clock. As another example, edge detector 104 and counter 106 may be triggered by both rising edges and falling edges of input signals 124 and 128. This causes counter 106 to count the number of rising and falling edges of VCO clock 118 that counter 106 receives during adjacent rising and falling edges (i.e., one-half clock period) of the frequency-divided clock. In each of these examples and in the example of FIG. 2, VCO clock 118 is locked to the frequency of reference clock 120 when M satisfies the predetermined relationship to N of M=N. Other relationships of M to N are, of course, possible. For example, in some embodiments of the present invention, edge detector 104 may be triggered only by rising edges of input signal 124, and counter 106 may be triggered by both rising and falling edges of input signal 128. In this embodiment, VCO clock 118 is locked to the frequency of reference clock 120 when M=2*N. For example, referring to FIG. 2 where N=5, VCO clock 208 has M=2*N=10 combined falling and rising edges from $t_1$ to $t_2$.

Figure 3:
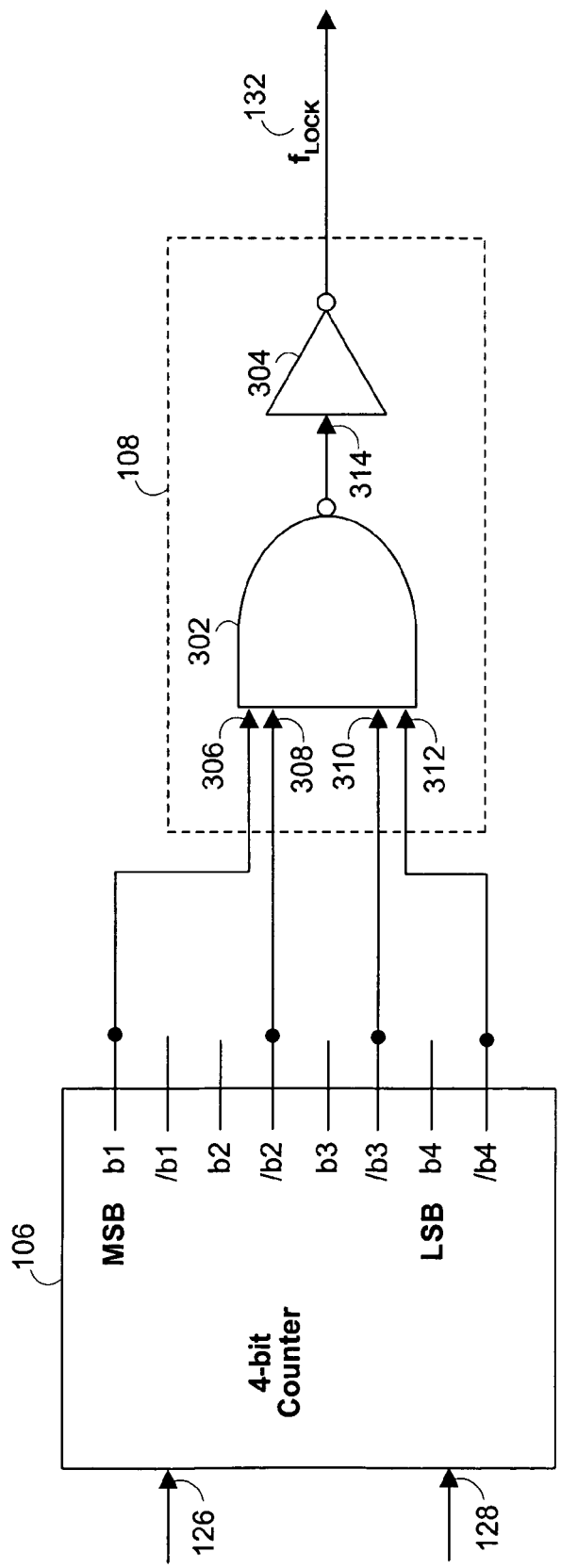
FIG. 3 is a block diagram showing additional details of the counter and decoder of the digital lock detector of FIG. 1 in accordance with one embodiment of the present invention.

FIG. 3 is a block diagram showing additional details of counter 106 and decoder 108 of digital lock detector 100 (FIG. 1) in accordance with one embodiment of the present invention. As shown in FIG. 3, counter 106 may be a Q-bit counter operative to count from 1 to $2^Q$, where Q is selected such that $2^Q$ is greater than or equal to about the value of M that satisfies the above-described predetermined relationship of M to N (e.g., M=N). Q is preferably selected such that $2^Q$ is greater than or equal to about twice this value of M. This allows counter 106 to detect the frequency of VCO clock 118 when clock 118 has up to twice the frequency of reference clock 120. For example, where the predetermined relationship of M to N is M=N, Q may be selected such that $2^Q \geq N$, and preferably, such that $2^Q \geq 2*N$.

Referring to FIGS. 1 and 3, counter 106 has Q outputs that collectively identify a Q-bit codeword that represents the number (M) of clock edges of clock 118 that counter 106 receives at input 128 between first and second digital state changes at input 126. Complement signals (i.e., logic inverts) of the Q outputs may also be provided by counter 106. Decoder 108 may be any suitable logic circuitry operative to output $f_{LOCK}$ signal 132 when counter 106 outputs the Q-bit codeword representing the value of M that satisfies the above-described predetermined relationship of M to N. For example, FIG. 3 illustrates the example in which Q=4 (i.e., counter 106 is a 4-bit counter), N=8 and the predetermined relationship of M to N is M=N (i.e., clock 118 is locked to the frequency of reference clock 120 when M=N=8). Counter 106 outputs a 4-bit codeword "b1, b2, b3, b4," where b1 is the most significant bit (MSB) and b4 is the least significant bit (LSB). Complement bits /b1, /b2, /b3 and /b4 of the 4-bit codeword are also output by counter 106. Decoder 108 includes 4-input NAND gate 302 and logic inverter 304 operative to output $f_{LOCK}$ signal 132 when M=N=8, or equivalently, when the 4-bit codeword is "1000" (i.e., "1000"=(1*$2^3$)+(0*$2^2$)+(0*$2^1$)+(0*$2^0$)=8). In particular, NAND gate 302 has a first input 306 coupled to b1, a second input 308 coupled to /b2, a third input 310 coupled to /b3 and a fourth input 312 coupled to /b4. Therefore, when the 4-bit codeword is "11000," the inputs to NAND gate 302 are "1111." This causes NAND gate 302 to output a logic "0" to input 314 of logic inverter 304, which causes logic inverter 304 to output a logic "1." In the example of FIG. 3, $f_{LOCK}$ signal 132 is an active high signal (i.e., $f_{LOCK}$ is a logic "1" when VCO clock 118 is locked to the frequency of reference clock 120). In other embodiments of the present invention, an active low $f_{LOCK}$ signal 132 may be provided. Such a signal 132 can be provided by, for example, using the output of NAND gate 302 as active low $f_{LOCK}$ signal 132.

Figure 4:
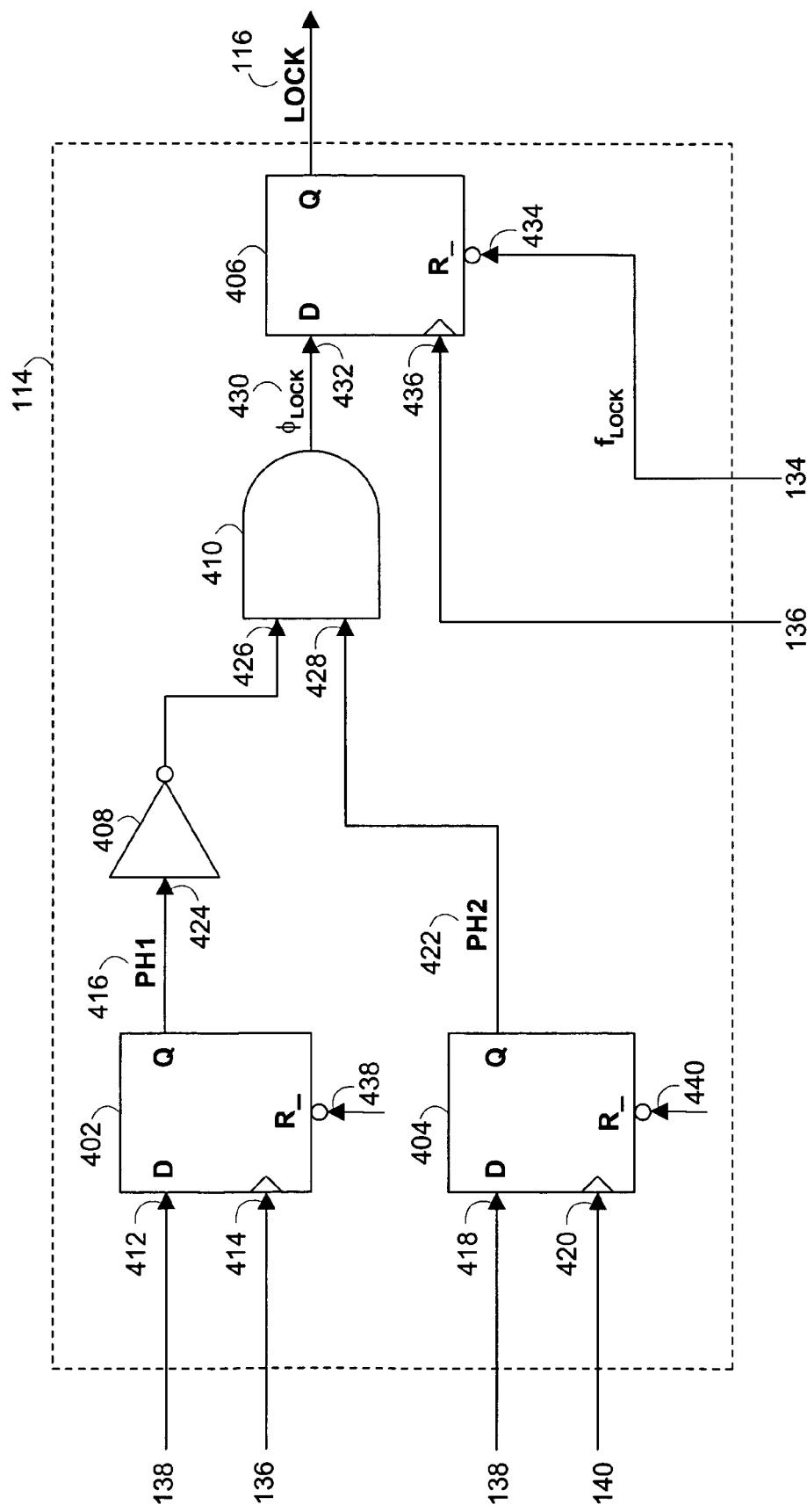
FIG. 4 is a block diagram showing additional details of the phase sampler of the digital lock detector of FIG. 1 in accordance with one embodiment of the present invention.

FIG. 4 is a block diagram showing additional details of phase sampler 114 of digital lock detector 100 (FIG. 1) in accordance with one embodiment of the present invention. Phase sampler 114 includes D flip-flops 402, 404 and 406, inverter 408 and AND gate 410. Each of D flip-flops 402, 404 and 406 has a data input (D), a clock input, a reset input (R_) and an output (Q). In general, a D flip-flop transfers data from data input (D) to output (Q) in response to receiving a clock edge at the clock input. The data transferred to output (Q) is the logic value (i.e., logic "1" or "0") of data input (D) immediately prior to the clock edge. The clock input may be triggered by either rising edges or falling edges of the clock input signal, depending on the chosen circuit implementation.

When reset input (R_) is active, output (Q) is maintained at a particular logic value (e.g., logic "0") and the D flip-flop is disabled from transferring data from input (D) to output (Q).

D flip-flops 402 and 404 function as lead/lag detectors of phase sampler 114. In particular, referring to FIGS. 1 and 4, D flip-flop 402 receives signal 138 (i.e., reference clock 120 or reference clock 120 delayed by delay 110) at data input 412 and signal 136 (i.e., VCO clock 118) at clock input 414. In response to receiving a clock edge at input 414, D flip-flop 402 outputs PH1 signal 416 indicating whether the phase of signal 138 leads or lags the phase of VCO clock 136. For example, when input 414 of D flip-flop 402 is triggered by rising edges of input signal 136, D flip-flop 402 outputs a logic "0" PH1 signal 416 to indicate that signal 138 lags VCO clock 136. D flip-flop 402 outputs a logic "1" PH1 signal 416 to indicate that signal 138 leads VCO clock 136. The reverse is true when input 414 of D flip-flop 402 is triggered by falling edges of input signal 136 (i.e., a logic "0" PH1 signal 416 indicates that signal 138 leads signal 136 and a logic "1" PH1 signal 416 indicates that signal 138 lags signal 136).

D flip-flop 404 receives signal 138 at input 418 and delayed VCO clock 140 at clock input 420. In response to receiving a clock edge at input 420, D flip-flop 404 outputs PH2 signal 422 indicating whether the phase of signal 138 leads or lags the phase of delayed VCO clock 140. For example, when input 420 of D flip-flop 404 is triggered by rising edges of input signal 140, D flip-flop 404 outputs a logic "0" PH2 signal 422 to indicate that signal 138 lags delayed VCO clock 140. D flip-flop 404 outputs a logic "1" PH2 signal 422 to indicate that signal 138 leads delayed VCO clock 140. The reverse is true when input 420 of D flip-flop 404 is triggered by falling edges of input signal 140 (i.e., a logic "0" PH2 signal 422 indicates that signal 138 leads signal 140 and a logic "1" PH2 signal 422 indicates that signal 138 lags signal 140). FIG. 4 shows the example in which D flip-flops 402 and 404 are triggered by rising edges of signals 136 and 140 at respective inputs 414 and 420.

VCO clock 118 is locked to the phase of reference clock 120 when the phase of signal 138 lags the phase of VCO clock 136 (i.e., VCO clock 118) and leads the phase of delayed VCO clock 140 (i.e., when the phase of signal 138 is between the phases of signals 136 and 140). Phase relationships between signals 136, 138 and 140 are further described below in connection with FIG. 5. In other words, in the example of FIG. 4, VCO clock 118 is phase-locked to reference clock 120 only when PH1 signal 416 is logic "0" and PH2 signal 422 is logic "1." Inverter 408 and AND gate 410 detect this condition as follows: Inverter 408 receives PH1 signal 416 at input 424, and outputs the logic invert of signal 416 to input 426 of AND gate 410. AND gate 410 receives PH2 signal 422 at input 428. AND gate 410 outputs $\phi_{LOCK}$ signal 430 indicating that VCO clock 118 is locked to the phase of reference clock 120 only when inputs 426 and 428 are logic "1," or equivalently, when PH1="0" and PH2 ="1." Inverter 408 and AND gate 410 are only exemplary. Any other suitable logic circuitry may be provided for detecting when PH1 signal 416 is logic "0" and PH2 signal 422 is logic "1." D flip-flop 406 receives $\phi_{LOCK}$ signal 430 at input 432. When $f_{LOCK}$ signal 134 is also received by D flip-flop 406 at input 434 (i.e., VCO clock 118 is also locked to the frequency of reference clock 120), D flip-flop 406 outputs LOCK signal 116 in response to an edge of signal 136 (i.e., VCO clock 118) at input 436. When $f_{LOCK}$ signal 134 is not received at input 434, the reset input of D flip-flop 406 is active. This disables D flip-flop 406 from outputting LOCK signal 116.

D flip-flops 402 and 404 are shown in FIG. 4 as receiving signals at respective reset inputs 438 and 440. In some embodiments of the present invention, reset inputs 438 and 440 may receive $f_{LOCK}$ signal 134. This prevents D flip-flops 402 and 404 from outputting signals PH1 416 and PH2 422 until VCO clock 118 is locked to the frequency of reference clock 120. In some embodiments of the present invention, reset inputs 438 and 440 may receive a signal that is not generated by digital lock detector 100. For example, reset inputs 438 and 440 may receive a system reset signal activated only upon power-up of digital lock detector 100. This forces outputs 416 and 422 to a particular logic state at power-up when outputs 416 and 422 would otherwise be undefined, and therefore prevents digital lock detector 100 from outputting a false LOCK signal 116.

Figure 5:
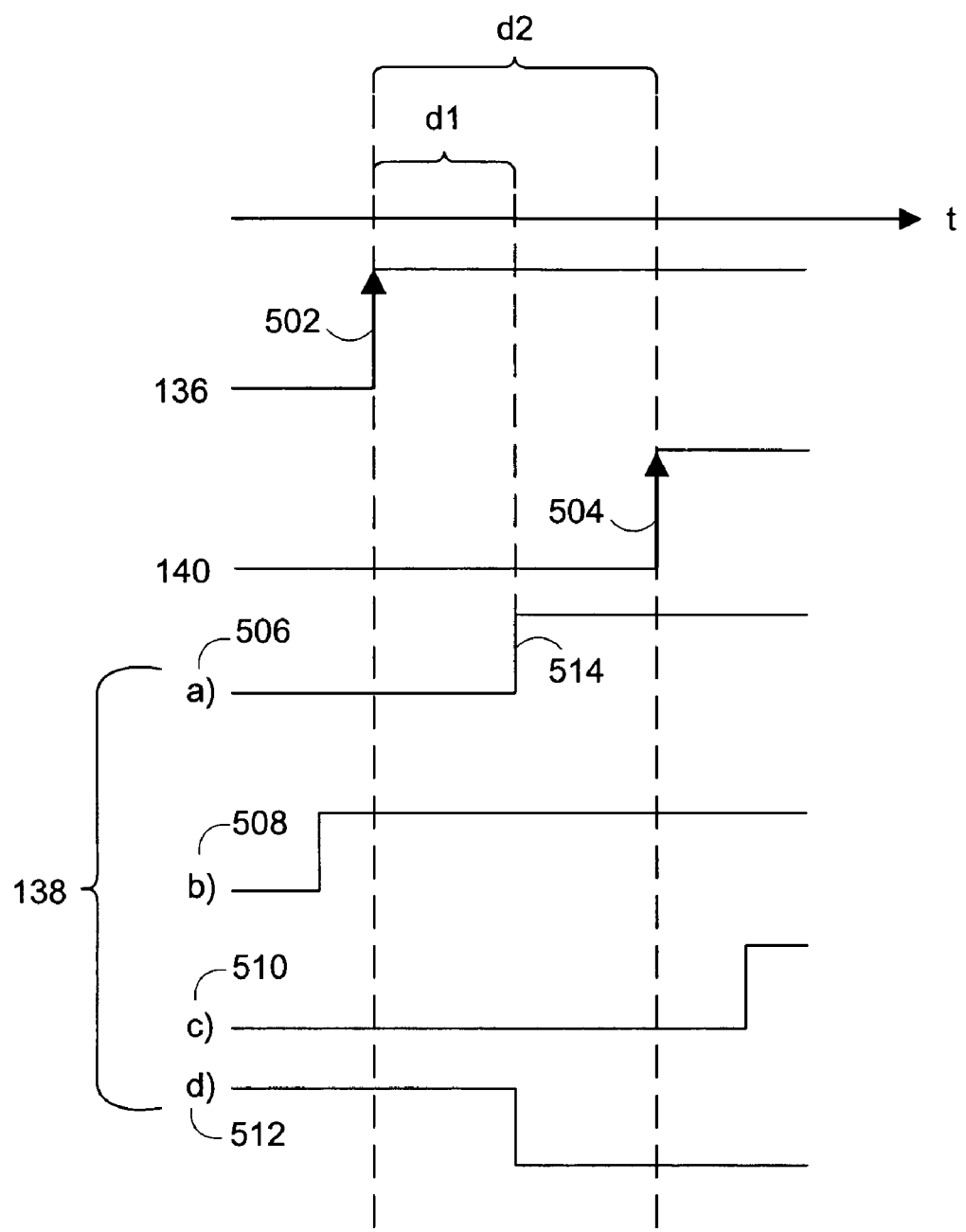
FIG. 5 is a timing diagram illustrating operation of the phase sampler of FIGS. 1 and 4 in accordance with one embodiment of the present invention.

FIG. 5 shows a timing diagram of input signals 136, 138 and 140 of phase sampler 114 (FIGS. 1 and 4). Referring to FIGS. 1, 4 and 5, D flip-flop 402 outputs as signal PH1 416 the logic value of signal 138 that D flip-flop 402 receives at input 412 immediately prior to receiving rising edge 502 of VCO clock 136 at input 414. D flip-flop 404 outputs as signal PH2 422 the logic value of signal 138 that D flip-flop 404 receives at input 418 immediately prior to receiving rising edge 504 of delayed VCO clock 140 at input 420. Four possible phase relationships of signals 136, 138 and 140 are shown in FIG. 5. For case a) 506, VCO clock 118 is locked to the phase of reference clock 120. VCO clock 118 is not phase-locked to reference clock 120 for cases b) 508, c) 510 and d) 512. In particular, for case a) 506, signal 138 is logic "0" immediately prior to rising edge 502 of VCO clock 136 (i.e., PH1="0"). Signal 138 is logic "1" immediately prior to rising edge 504 of delayed VCO clock 140 (i.e., PH2="1"). Put another way, rising edge 514 of signal 138 is between rising edges 502 and 504 of respective signals 136 and 140 for case a) 506. This means that the phase of signal 138 lags the phase of VCO clock 136 and leads the phase of delayed VCO clock 140. In case b) 508, signal 138 leads both VCO clock 136 and delayed VCO clock 140 (i.e., PH1="1" and PH2="1"). In case c) 510, signal 138 lags both VCO clock 136 and delayed VCO clock 140 (i.e., PH1="0" and PH2="0"). Case d) 512 represents the situation in which VCO clock 136 (i.e., VCO clock 118) is approximately 180 degrees out of phase with reference clock 120. In particular, signal 138 has a falling edge that is between rising edges 502 and 504 of VCO clock 136 and VCO clock 140 (i.e., PH1="1" and PH2="0").

As shown in FIG. 5, rising edge 502 of VCO clock 136 leads rising edge 504 of delayed VCO clock 140 by time d2 (i.e., the time delay of delay 112). The value of d2 determines the maximum phase error $\phi_{error}$ that can be observed in VCO clock 118 relative to reference clock 120 when digital lock detector 100 outputs LOCK signal 116. $\phi_{error}$ can be approximated in degrees by the following equation:

$$\phi_{error} = (d2/T_{ref}) * 360°$$

where d2 is the time delay of delay 112 and $T_{ref}$ is the period (i.e., $1/f_{ref}$) of reference clock 120. This equation holds for the case in which input 138 of digital lock detector 100 receives reference clock 120. When input 138 receives reference clock 120 delayed by time delay (d1) 110 (i.e., when delay 110 is included in digital lock detector 100), the maximum phase error is reduced. In particular, when input 138 receives the delayed reference clock, d1 and d2 are selected such that d2 is greater than d1. Preferably, d1 and d2 are selected such that d2=2*d1, which causes the maximum phase error in VCO clock 118 relative to reference clock 120 to be plus or minus $\phi_{error}/2$ when digital lock detector 100 outputs LOCK signal 116. For example, when $T_{ref}$=100 ns (i.e., $f_{ref}$=10 MHz), d2=200 ps and d1=100 ps, the maximum phase error in VCO clock 118 relative to reference clock 120 is plus or minus (½)*(360°)*(200 ps)/(100 ns)=0.36°.

Figure 6:
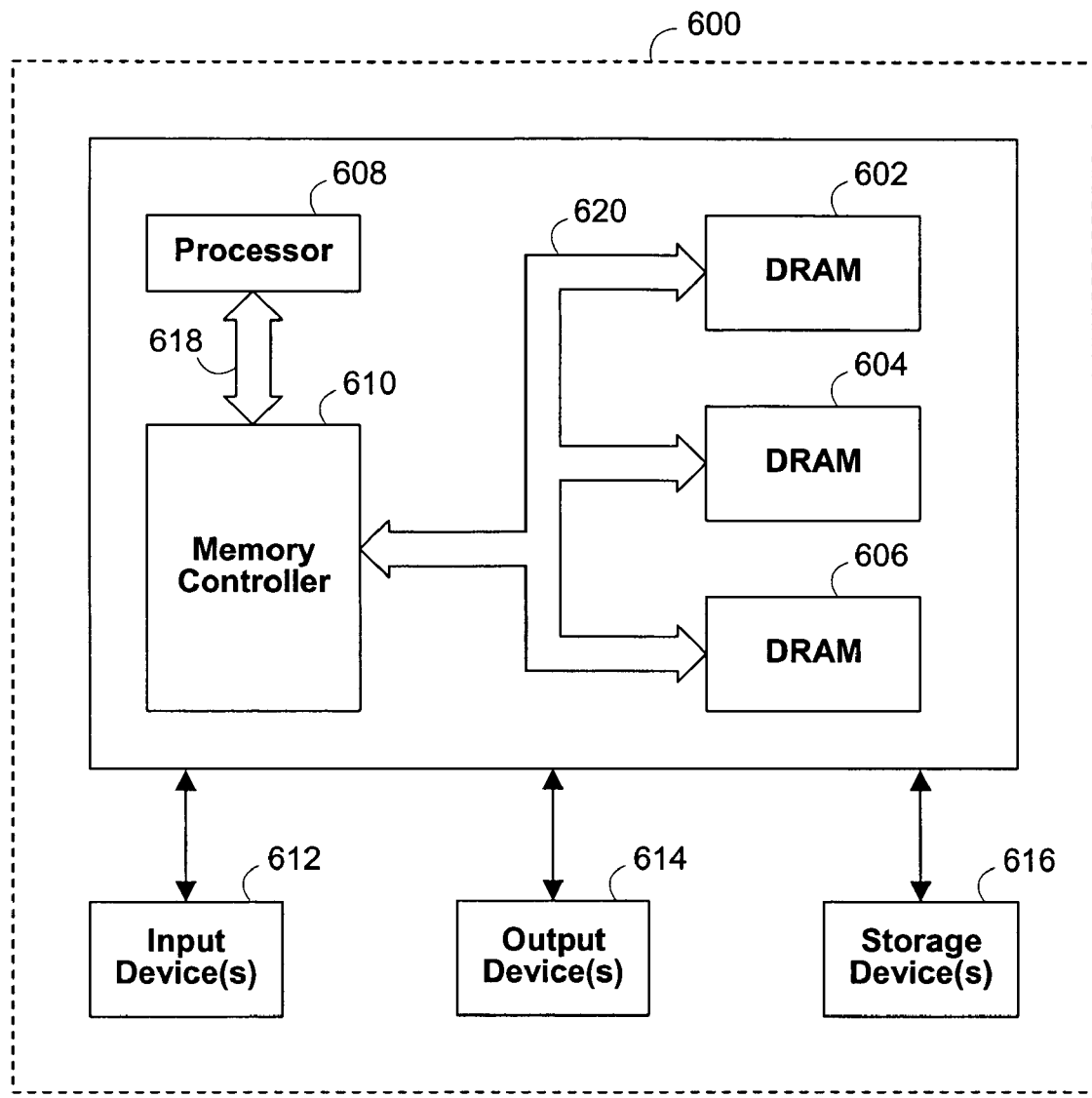
FIG. 6 is a block diagram of a system that incorporates the invention.

FIG. 6 shows a system 600 that incorporates the invention. System 600 includes a plurality of DRAM chips 602, 604, and 606, a processor 608, a memory controller 610, input devices 612, output devices 614, and optional storage devices 616. DRAM chips 602, 604, and 606 include an array of memory cells. One or more DRAM chips 602, 604, and 606 also include one or more circuits of the invention to detect a lock condition of an associated PLL circuit. The circuits of the invention may be used to, for example, compensate for clock-to-output data skew of the DRAM chip. In particular, the LOCK output of the circuits of the invention may be coupled to a DRAM read latency calculator. When the LOCK output is active (i.e., a PLL VCO clock is locked to a reference clock), the read latency calculator begins calculating the number of VCO clock cycles (e.g., 10 clock cycles) that pass from the time a given DRAM memory column is accessed to the time that the data corresponding to the column is observed at an output of the DRAM chip. Data and control signals are transferred between processor 608 and memory controller 610 via bus 620. Similarly, data and control signals are transferred between memory controller 610 and DRAM chips 602, 604, and 606 via bus 620. Input devices 612 can include, for example, a keyboard, a mouse, a touch-pad display screen, or any other appropriate device that allows a user to enter information into system 600. Output devices 614 can include, for example, a video display unit, a printer, or any other appropriate device capable of providing output data to a user. Note that input devices 612 and output devices 614 can alternatively be a single input/output device. Storage devices 616 can include, for example, one or more disk or tape drives.

Thus it is seen that circuits and methods for detecting a PLL lock condition using digital components are provided. One skilled in the art will appreciate that the invention can be practiced by other than the described embodiments, which are presented for purposes of illustration and not of limitation, and the present invention is limited only by the claims which follow.

I claim:

1. A method for detecting that an output clock is locked to a reference clock, said method comprising:
   receiving said reference clock;
   frequency dividing said reference clock by a factor N to produce a frequency-divided clock;
   receiving said output clock;
   counting a number M of clock edges of said output clock during a time interval of said frequency-divided clock, wherein said output clock is frequency-locked to said reference clock when said number M satisfies a predetermined relationship to said factor N;
   comparing phases of said output clock, a delayed version of said output clock and said reference clock, wherein said output clock is phase-locked to said reference clock when said phase of said reference clock is between said phases of said output clock and said delayed output clock; and
   outputting a signal indicating that said output clock is frequency-locked and phase-locked to said reference clock.

2. The method of claim 1 wherein said counting comprises counting a number of rising edges of said output clock.

3. The method of claim 1 wherein said counting comprises counting a number of falling edges of said output clock.

4. The method of claim 1 wherein said counting comprises counting said number M of clock edges of said output clock during one clock period of said frequency-divided clock.

5. The method of claim 1 wherein said output clock is frequency-locked to said reference clock when said number M equals said factor N.

6. The method of claim 1 wherein said comparing phases comprises detecting whether said reference clock leads or lags said output clock.

7. The method of claim 1 wherein said comparing phases comprises detecting whether said reference clock leads or lags said delayed version of said output clock.

8. The method of claim 1 further comprising delaying said reference clock in order to produce a delayed version of said reference clock, wherein said comparing phases comprises comparing phases of said output clock, said delayed version of said output clock and said delayed version of said reference clock, wherein said output clock is phase-locked to said reference clock when said phase of said delayed version of said reference clock is between said phases of said output clock and said delayed output clock.

9. The method of claim 8 wherein said delaying said reference clock comprises delaying said reference clock by an amount of delay that is one-half an amount of delay used to produce said delayed output clock.

10. The method of claim 1 further comprising:
    detecting a first edge of said frequency-divided clock;
    beginning counting said number M of clock edges in response to said detecting said first edge;
    detecting a second edge of said frequency-divided clock; and
    discontinuing counting said number M of clock edges in response to said detecting said second edge.

11. The method of claim 1 wherein said output signal comprises a signal output by a voltage-controlled oscillator of a phase-locked loop.

12. A method for detecting that an output clock is locked to a reference clock, said method comprising:
    receiving said reference clock;
    frequency dividing said reference clock by a factor N to produce a frequency-divided clock;
    receiving said output clock;
    counting a number M of clock edges of said output clock during a time interval of said frequency divided clock, wherein said output clock is frequency-locked to said reference clock when said number M satisfies a predetermined relationship to said factor N;
    detecting whether said reference clock leads or lags said output clock;
    detecting whether said reference clock leads or lags a delayed version of said output clock, wherein said output clock is phase-locked to said reference clock when said reference clock lags said output clock and leads said delayed output clock; and
    outputting a signal indicating that said output clock is frequency-locked and phase-locked to said reference clock.

13. A circuit for detecting that an output clock is locked to a reference clock, said circuit comprising:
    a frequency divider operative to receive said reference clock as input, and to frequency divide said reference clock by a factor N in order to produce a frequency-divided clock;
    a counter operative to receive said output clock as input, and to count a number M of clock edges of said output clock during a time interval of said frequency-divided clock, wherein said output clock is frequency-locked to said reference clock when said number M satisfies a predetermined relationship to said factor N; and a phase sampler operative to:
receive as input and compare phases of said output clock, a delayed version of said output clock and said reference clock, wherein said output clock is phase-locked to said reference clock when said phase of said reference clock is between said phases of said output clock and said delayed output clock; and
output a signal indicating that said output clock is frequency-locked and phase-locked to said reference clock.

14. The circuit of claim 13 wherein said counter is operative to count rising edges of said output clock.

15. The circuit of claim 13 wherein said counter is operative to count falling edges of said output clock.

16. The circuit of claim 13 wherein said counter is operative to count said number M of clock edges of said output clock during one clock period of said frequency-divided clock.

17. The circuit of claim 13 wherein said output clock is frequency-locked to said reference clock when said number M equals said factor N.

18. The circuit of claim 13 wherein said phase sampler comprises a flip-flop that is operative to detect whether said reference clock leads or lags said output clock.

19. The circuit of claim 13 wherein said phase sampler comprises a flip-flop that is operative to detect whether said reference clock leads or lags said delayed version of said output clock.

20. The circuit of claim 13 wherein said counter is operative to output a signal indicating said number M and wherein said circuit further comprises a decoder operative to receive said signal indicating said number M, and to determine whether said number M satisfies said predetermined relationship to said factor N.

21. The circuit of claim 13 further comprising an edge detector operative to:
receive said frequency-divided clock as input;
output a signal indicating a first edge of said frequency-divided clock to said counter, wherein said counter begins counting said number M of clock edges in response to receiving said signal indicating said first edge; and
output a signal indicating a second edge of said frequency-divided clock to said counter, wherein said counter discontinues counting said number M of clock edges in response to receiving said signal indicating said second edge.

22. The circuit of claim 13 wherein said output signal comprises a signal output by a voltage-controlled oscillator of a phase-locked loop.

23. The circuit of claim 15 wherein said phase sampler comprises a flip-flop that is operative to output said signal indicating that said output clock is frequency-locked and phase-locked to said reference clock.

24. The circuit of claim 15 further comprising a delay operative to delay said reference clock in order to produce a delayed version of said reference clock, wherein said phase sampler is operative to receive as input and compare phases of said output clock, said delayed version of said output clock and said delayed version of said reference clock, wherein said output clock is phase-locked to said reference clock when said phase of said delayed version of said reference clock is between said phases of said output clock and said delayed output clock.

25. The circuit of claim 24 wherein said delay delays said reference clock by an amount of delay that is one-half an amount of delay used to produce said delayed output clock.

26. A circuit for detecting that an output clock is locked to a reference clock, said circuit comprising:
a frequency divider operative to receive said reference clock as input, and to frequency divide said reference clock by a factor N in order to produce a frequency-divided clock;
a counter operative to receive said output clock as input, and to count a number M of clock edges of said output clock during a time interval of said frequency-divided clock, wherein said output clock is frequency-locked to said reference clock when said number M satisfies a predetermined relationship to said factor N;
a first flip-flop operative to receive said output clock and said reference clock, and to detect whether said reference clock leads or lags said output clock;
a second flip-flop operative to receive a delayed version of said output clock and said reference clock, and to detect whether said reference clock leads or lags said delayed version of said output clock, wherein said output clock is phase-locked to said reference clock when said reference clock lags said output clock and leads said delayed output clock; and
a third flip-flop operative to receive a first signal indicating whether said output clock is frequency-locked to said reference clock and a second signal indicating whether said output clock is phase-locked to said output clock as input, and to output a signal indicating that said output clock is frequency-locked and phase-locked to said reference clock.

27. Apparatus for detecting that an output clock is locked to a reference clock, said apparatus comprising:
means for receiving said reference clock;
means for frequency dividing said reference clock by a factor N to produce a frequency-divided clock;
means for receiving said output clock;
means for counting a number M of clock edges of said output clock during a time interval of said frequency-divided clock, wherein said output clock is frequency-locked to said reference clock when said number M satisfies a predetermined relationship to said factor N;
means for comparing phases of said output clock, a delayed version of said output clock and said reference clock, wherein said output clock is phase-locked to said reference clock when said phase of said reference clock is between said phases of said output clock and said delayed output clock; and
means for outputting a signal indicating that said output clock is frequency-locked and phase-locked to said reference clock.

28. A computer system comprising:
a processor;
a memory controller coupled to said processor;
a plurality of dynamic random access memory (DRAM) chips coupled to said memory controller, at least one of said DRAM chips comprising at least one circuit for detecting that an output clock is locked to a reference clock, said at least one circuit comprising:
circuitry for receiving said reference clock;
circuitry for frequency dividing said reference clock by a factor N to produce a frequency-divided clock;
circuitry for receiving said output clock;
circuitry for counting a number M of clock edges of said output clock during a time interval of said frequency-divided clock, wherein said output clock is frequency-locked to said reference clock when said number M satisfies a predetermined relationship to said factor N;

circuitry for comparing phases of said output clock, a delayed version of said output clock and said reference clock, wherein said output clock is phase-locked to said reference clock when said phase of said reference clock is between said phases of said output clock and said delayed output clock; and circuitry for outputting a signal indicating that said output clock is frequency-locked and phase-locked to said reference clock.

* * * * *